United States Patent
Yudovsky et al.

(10) Patent No.: US 10,494,736 B2
(45) Date of Patent: Dec. 3, 2019

(54) DEVICE TO INCREASE DEPOSITION UNIFORMITY IN SPATIAL ALD PROCESSING CHAMBER

(71) Applicant: Applied Materials, Inc., Santa Clara, CA (US)

(72) Inventors: Joseph Yudovsky, Campbell, CA (US); Alexander S. Polyak, Palm Coast, FL (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/637,772

(22) Filed: Jun. 29, 2017

(65) Prior Publication Data

US 2018/0002830 A1    Jan. 4, 2018

Related U.S. Application Data

(60) Provisional application No. 62/357,993, filed on Jul. 2, 2016.

(51) Int. Cl.

| | |
|---|---|
| *C23C 16/00* | (2006.01) |
| *C30B 25/10* | (2006.01) |
| *C23C 16/458* | (2006.01) |
| *C23C 16/46* | (2006.01) |
| *C30B 25/12* | (2006.01) |
| *H01L 21/67* | (2006.01) |
| *H01L 21/687* | (2006.01) |
| *C23C 16/455* | (2006.01) |

(52) U.S. Cl.
CPC .......... *C30B 25/10* (2013.01); *C23C 16/4586* (2013.01); *C23C 16/45546* (2013.01); *C23C 16/46* (2013.01); *C30B 25/12* (2013.01); *H01L 21/67103* (2013.01); *H01L 21/67109* (2013.01); *H01L 21/67161* (2013.01); *H01L 21/68764* (2013.01); *H01L 21/68771* (2013.01); *C23C 16/4584* (2013.01); *C23C 16/45548* (2013.01)

(58) Field of Classification Search
CPC ....... C23C 16/00; C23C 16/455; C23C 16/44; C23C 16/458
See application file for complete search history.

(56) References Cited

U.S. PATENT DOCUMENTS

| | | | |
|---|---|---|---|
| 9,167,625 B2 | 10/2015 | Shero et al. | |
| 2004/0261722 A1 | 12/2004 | Nguyen et al. | |
| 2005/0178334 A1 | 8/2005 | Shinma et al. | |
| 2011/0147363 A1 | 6/2011 | Yap et al. | |
| 2013/0118407 A1 | 5/2013 | Park et al. | |
| 2013/0126515 A1 | 5/2013 | Shero et al. | |
| 2016/0177450 A1 | 6/2016 | Kanno | |

FOREIGN PATENT DOCUMENTS

| | | |
|---|---|---|
| JP | 11-186176 A | 7/1999 |
| JP | 2005229043 A | 8/2005 |
| KR | 101202437 A | 11/2012 |

OTHER PUBLICATIONS

PCT International Search Report and Written Opinion in PCT/US2017/040257 dated Sep. 19, 2017, 10 pages.

*Primary Examiner* — Robert M Kunemund
(74) *Attorney, Agent, or Firm* — Servilla Whitney LLC

(57) ABSTRACT

Susceptor assemblies comprising a susceptor with a top surface with a plurality of recesses and a bottom surface are described. A heater is positioned below the susceptor to heat the susceptor. A shield is positioned between the bottom surface of the susceptor and the heater. The shield increases deposition uniformity across the susceptor.

20 Claims, 6 Drawing Sheets

DEVICE TO INCREASE DEPOSITION UNIFORMITY IN SPATIAL ALD PROCESSING CHAMBER

CROSS-REFERENCE TO RELATED APPLICATIONS

This application claims priority to U.S. Provisional Application No. 62/357,993, filed Jul. 2, 2016, the entire disclosure of which is hereby incorporated by reference herein.

TECHNICAL FIELD

The present disclosure relates generally to apparatus for depositing thin films. In particular, the disclosure relates to apparatus for depositing thin films in a spatial atomic layer deposition batch processing chamber.

BACKGROUND

Wafer temperature uniformity is important in atomic layer deposition (ALD) processes. Deposition uniformity in spatial ALD batch processes reactors can be challenging where the wafer is positioned on a susceptor moving above an infrared heating system. Traditionally, for improvement of temperature uniformity, multi-zone heating is used. However, the systems used for improved temperature uniformity are complex and the cost is proportional to the number of heating zones. Moreover, for spatial ALD systems with rotating susceptors it is very difficult to achieve good temperature distribution in the tangential direction and, as a result, leading and trailing edge temperatures are very difficult to homogenize with the rest of the wafer surface resulting in non-uniform deposition.

Therefore, there is a need in the art for apparatus and methods to increase deposition uniformity in batch processing chambers.

SUMMARY

One or more embodiments of the disclosure are directed to susceptor assemblies comprising a susceptor with a top surface and a bottom surface. The top surface has a plurality of recesses formed therein. The recesses are sized to support a substrate during processing. A heater is positioned below the susceptor to heat the susceptor. A shield is positioned between the bottom surface of the susceptor and the heater. The shield increases deposition uniformity across the susceptor.

Additional embodiments of the disclosure are directed to susceptor assemblies comprising a susceptor with a top surface and a bottom surface. The top surface has a plurality of recesses formed therein. The recesses are sized to support a substrate during processing. A heater is positioned below the susceptor to heat the susceptor. A shield is positioned between the bottom surface of the susceptor and the heater. The shield comprises a plurality of shield segments. Each shield segment is positioned in a region between the recesses and increasing deposition uniformity across the susceptor and is contoured to have a shape similar to a shape of the recesses and cover more of a leading edge of a recess than a trailing edge of an adjacent recess. Each shield segment includes a plurality of openings therethrough. A plurality of suspension rods connects the susceptor and the shield. The suspension rods pass through the plurality of openings in the shield segments to support the shield segments and maintain a gap between the shield segments and the susceptor.

Further embodiments of the disclosure are directed to susceptor assemblies comprising a susceptor with a top surface and a bottom surface. The top surface has a plurality of recesses formed therein. The recesses are sized to support a substrate during processing. A heater is positioned below the susceptor to heat the susceptor. A shield is positioned between the bottom surface of the susceptor and the heater. The shield increases deposition uniformity across the susceptor. The shield has a ring shape with an inner edge and an outer edge. The inner edge is closer to a center of the susceptor than the outer edge. The shield includes a plurality of protrusions extending inwardly from the inner edge, each protrusion having an opening therethrough. The distance from the inner edge of the shield to the outer edge of the shield covers at least about ⅔ of a width of the recess. A plurality of suspension rods connects to the susceptor and supports the shield and maintains a gap between the shield and the susceptor. Each of the suspension rods pass through an opening in the shield.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Figure 1:
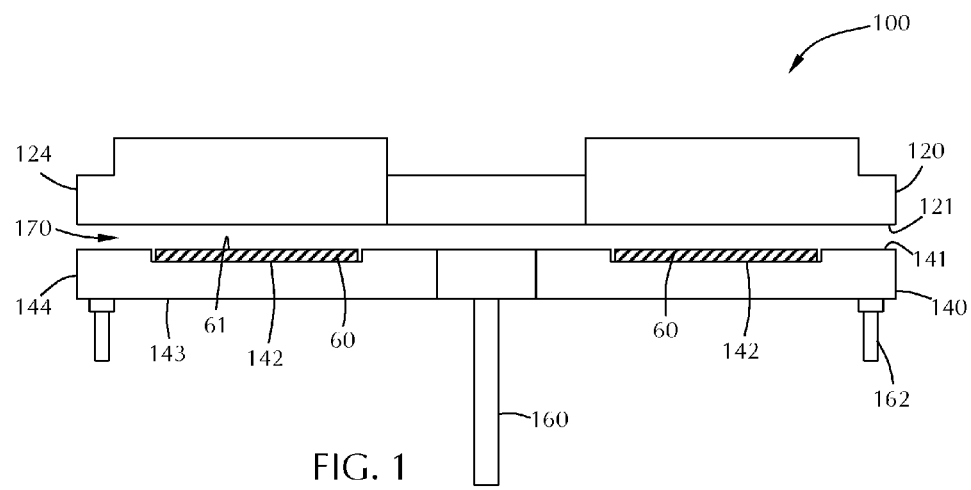
FIG. 1 shows a cross-sectional view of a batch processing chamber in accordance with one or more embodiment of the disclosure.

Some embodiments of the disclosure are directed to processes of depositing a spacer material using a batch processing chamber, also referred to as a spatial processing chamber. FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. In a binary reaction, the plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the process region through the purge gas P channel(s). A substrate moving from one end of the gas distribution assembly to the other end will be exposed to each of the process gases in turn, forming a layer on the substrate surface.

Figure 2:
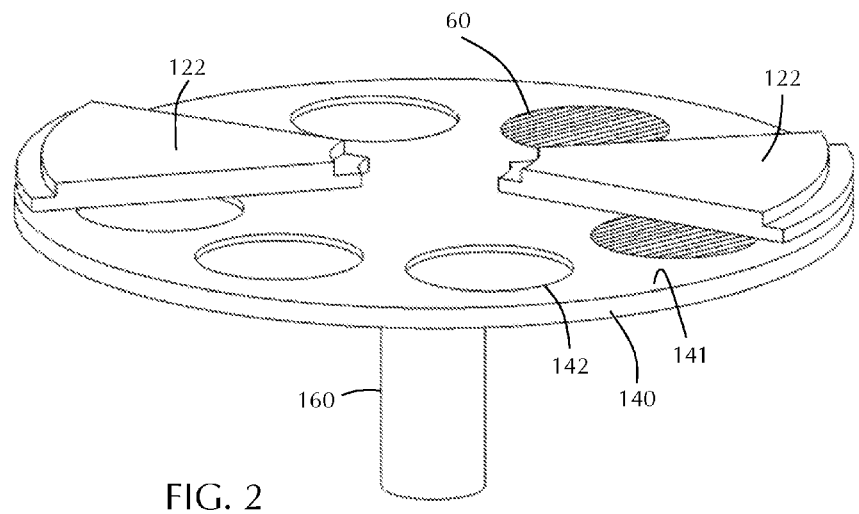
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

A susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within 0.5 mm, ±0.4 mm, ±0.35 mm, ±0.30 mm, ±0.25 mm, ±0.20 mm, ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120. In some embodiments, the heater is not part of the susceptor assembly. In some embodiments, the heater is a separate component from the susceptor assembly. In some embodiments, the heater is separate from the susceptor assembly and is configured to move along with the susceptor assembly to maintain a fixed distance between the susceptor assembly and the heater.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
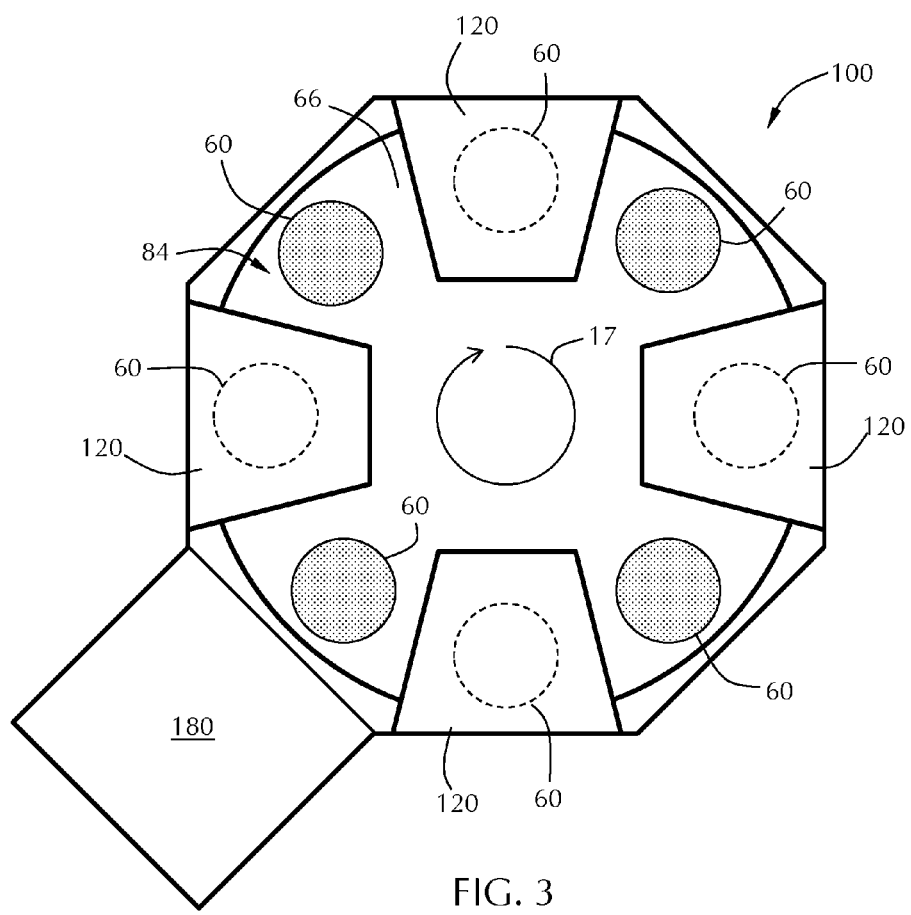
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the injector assemblies 30. Rotating 17 the susceptor assembly 140 by 45° will result in each substrate 60 which is between gas distribution assemblies 120 to be moved to an gas distribution assembly 120 for film deposition, as illustrated by the dotted circle under the gas distribution assemblies 120. An additional 45° rotation would move the substrates 60 away from the injector assemblies 30. The number of substrates 60 and gas distribution assemblies 120 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4× wafers being processed, where x is an integer value greater than or equal to one. In an exemplary embodiment, the gas distribution assembly 120 includes eight process regions separated by gas curtains and the susceptor assembly 140 can hold six wafers.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called injector assemblies 30) evenly spaced about the processing chamber 100. The processing chamber 100 shown is octagonal; however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the chamber 100. A wafer robot may be positioned in the chamber 180 to move the substrate onto the susceptor.

Rotation of the carousel (e.g., the susceptor assembly 140) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 4:
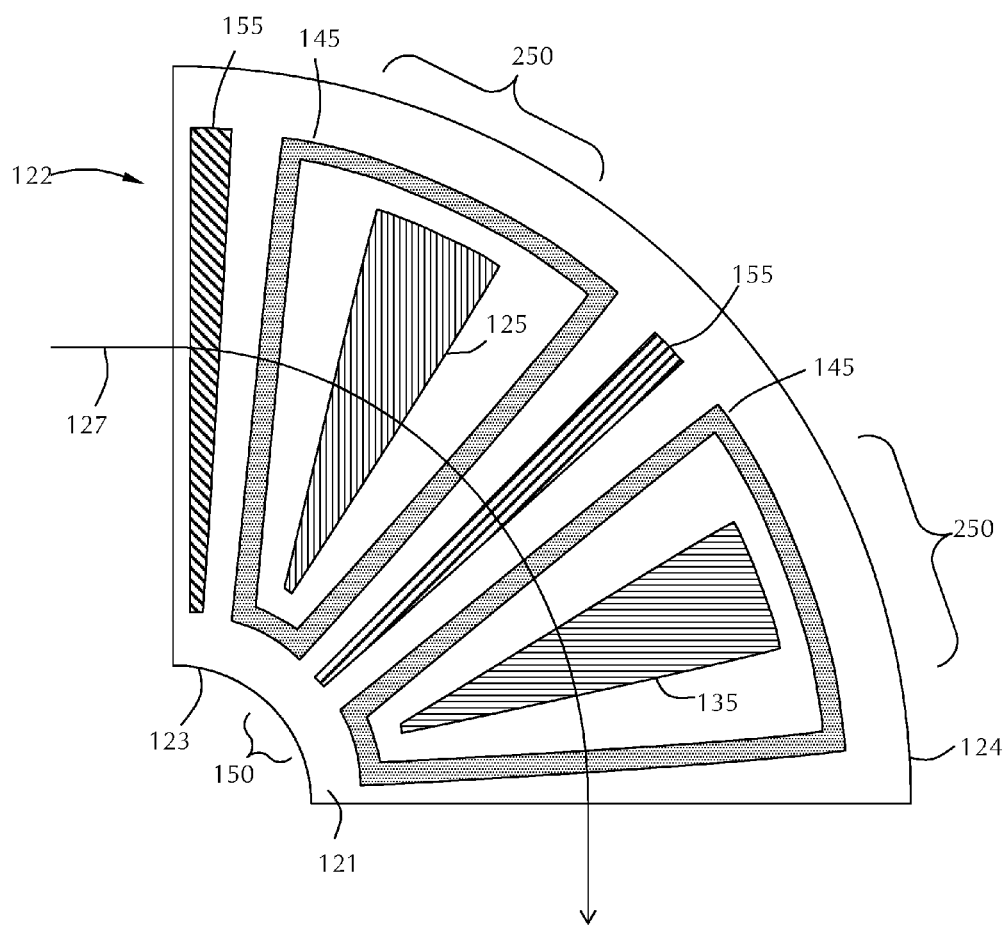
FIG. 4 shows a schematic view of a portion of a wedge shaped gas distribution assembly for use in a batch processing chamber in accordance with one or more embodiment of the disclosure.
Figure 5:
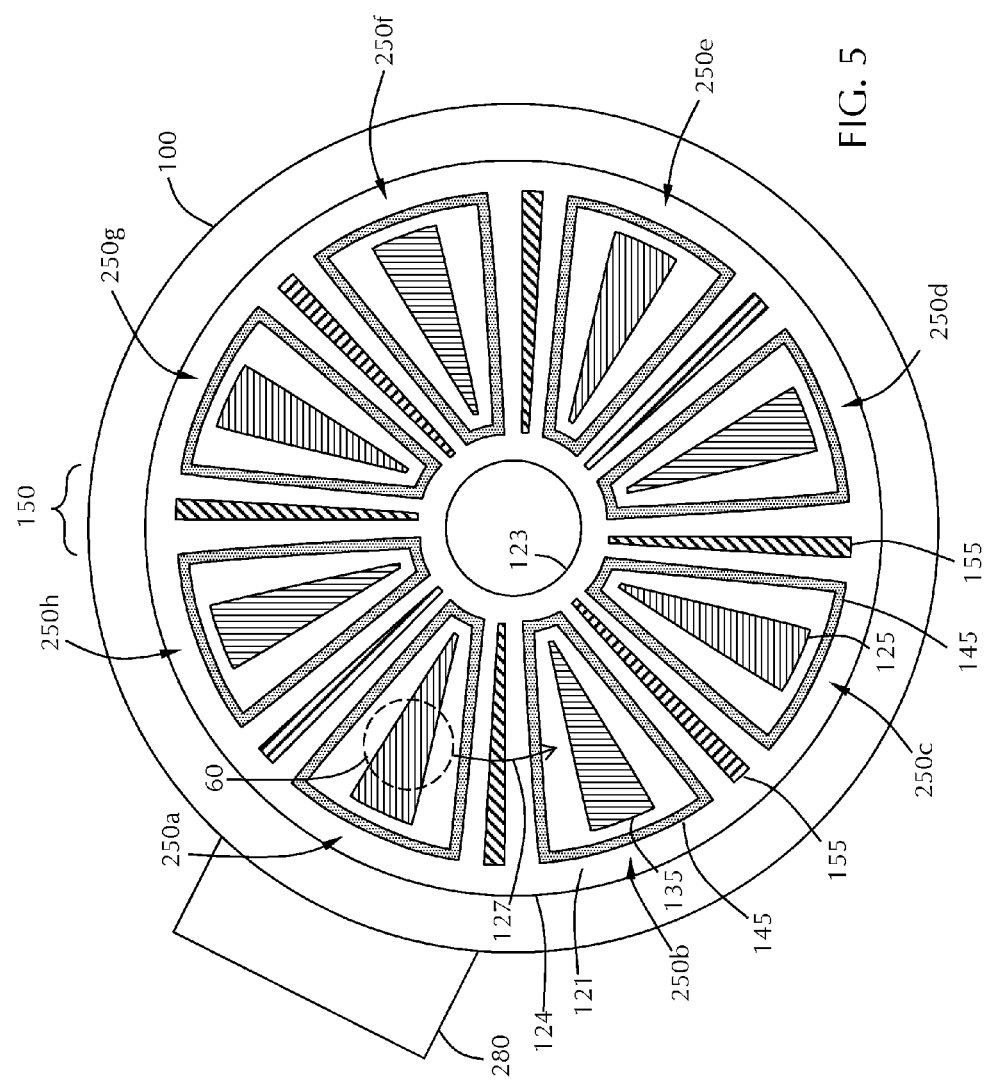
FIG. 5 shows a schematic view of a batch processing chamber in accordance with one or more embodiment of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 145 in a front surface 121 of the gas distribution assembly 220. The plurality of elongate gas ports 125, 135, 145, 155 extend from an area adjacent the inner peripheral edge 123 toward an area adjacent the outer peripheral edge 124 of the gas distribution assembly 220. The plurality of gas ports shown include a first reactive gas port 125, a second gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second gas port 135 and a vacuum port 145. Thus, at the end of the path 127 shown in FIG. 4, the substrate has been exposed to the first reactive gas 125 and the second reactive gas 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of process regions 250. The process regions are roughly defined around the individual gas ports 125, 135 with the gas curtain 150 between 250. The embodiment shown in FIG. 5 makes up eight separate process regions 250 with eight separate gas curtains 150 between. A processing chamber can have at least two process region. In some embodiments, there are at least three, four, five, six, seven, eight, nine, 10, 11 or 12 process regions.

During processing a substrate may be exposed to more than one process region 250 at any given time. However, the portions that are exposed to the different process regions will have a gas curtain separating the two. For example, if the leading edge of a substrate enters a process region including the second gas port 135, a middle portion of the substrate will be under a gas curtain 150 and the trailing edge of the substrate will be in a process region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution plate 120. The substrate 60 is loaded via the factory interface 280 into the processing chamber 100 onto a substrate support or susceptor assembly (see FIG. 3). The substrate 60 can be shown positioned within a process region because the substrate is located adjacent the first reactive gas port 125 and between two gas curtains 150a, 150b. Rotating the substrate 60 along path 127 will move the substrate counter-clockwise around the processing chamber 100. Thus, the substrate 60 will be exposed to the first process region 250a through the eighth process region 250h, including all process regions between.

Embodiments of the disclosure are directed to processing methods comprising a processing chamber 100 with a plurality of process regions 250a-250h with each process region separated from an adjacent region by a gas curtain 150. For example, the processing chamber shown in FIG. 5. The number of gas curtains and process regions within the processing chamber can be any suitable number depending on the arrangement of gas flows. The embodiment shown in FIG. 5 has eight gas curtains 150 and eight process regions 250a-250h.

A plurality of substrates 60 are positioned on a substrate support, for example, the susceptor assembly 140 shown FIGS. 1 and 2. The plurality of substrates 60 are rotated around the process regions for processing. Generally, the gas curtains 150 are engaged (gas flowing and vacuum on) throughout processing including periods when no reactive gas is flowing into the chamber.

Accordingly, one or more embodiments of the disclosure are directed to processing methods utilizing a batch processing chamber like that shown in FIG. 5. A substrate 60 is placed into the processing chamber which has a plurality of sections 250, each section separated from adjacent section by a gas curtain 150.

Some embodiments of the disclosure incorporate dynamic IR shields attached to the bottom surface of the susceptor and are rotated with the susceptor to create a permanent coverage under the wafer in areas of interest. Varying the shape of the shield can be used to modulate local temperatures on the wafer surface facing the showerhead. In some embodiments the shield is suspended from the bottom of the susceptor via a threaded fastener with locating features. Spacing between the shield and the susceptor can vary to further impact temperature distribution. The shield materials may also be selected in such a way that impact wafer temperature distribution.

Figure 6:
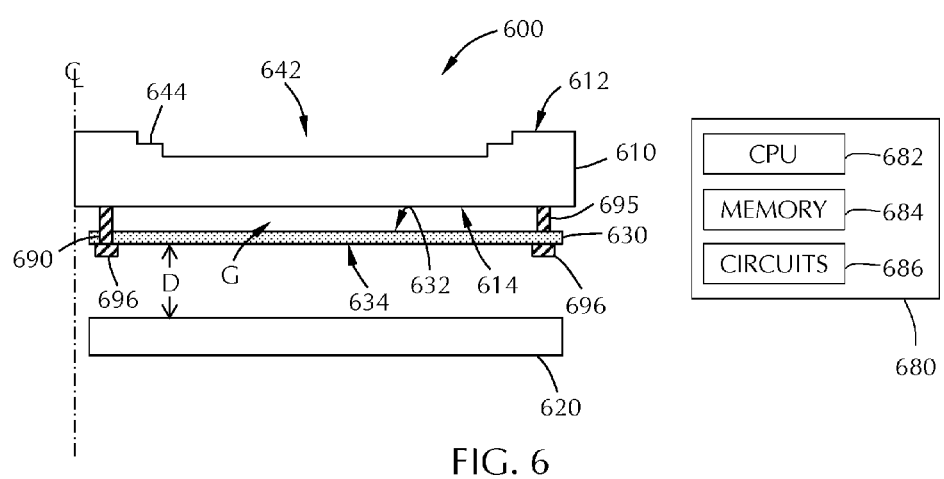
FIG. 6 shows a side view of a susceptor assembly in accordance with one or more embodiment of the disclosure.

Referring to FIG. 6, one or more embodiment of the disclosure is directed to susceptor assemblies 600. The susceptor assemblies 600 comprise a susceptor 610 with a top surface 612 and a bottom surface 614. A plurality of recesses 642 are formed in the top surface 612 of the susceptor 610. The recesses 642 are sized to support a substrate (or wafer) during processing. The recess 642 shown in FIG. 6 includes an outer peripheral ledge 644 to support an outer edge of the wafer. However, those skilled in the art will understand that the recess 642 can have a flat bottom, like that illustrated in FIG. 1. The outer peripheral ledge 644 is merely one possible configuration for the recess 642.

A heater 620 is positioned below the susceptor 610 to heat the susceptor 610. The heater 620 can be any suitable type of heater including, but not limited to, radiant heaters that emit infrared (IR) radiation to heat the bottom surface 614 of the susceptor 610. In some embodiments, the heater 620 is not part of the susceptor assembly 600 and is separate from the susceptor 610. In some embodiments, the heater is a separate component from the susceptor assembly. In some embodiments, the heater 620 is an infrared heater. In some embodiments, the heater 620 is not an induction heater.

A shield 630 is positioned between the bottom surface 614 of the susceptor 610 and the heater 620. The shield 630 has a top surface 632 facing the bottom surface 614 of the susceptor and a bottom surface 634 facing the heater 620. The shield 630 increases deposition uniformity across the recesses 642 of the susceptor 610. In some embodiments, the shield 630 increases deposition uniformity and decreases temperature uniformity across the recesses 642, and across the substrate.

Figure 7:
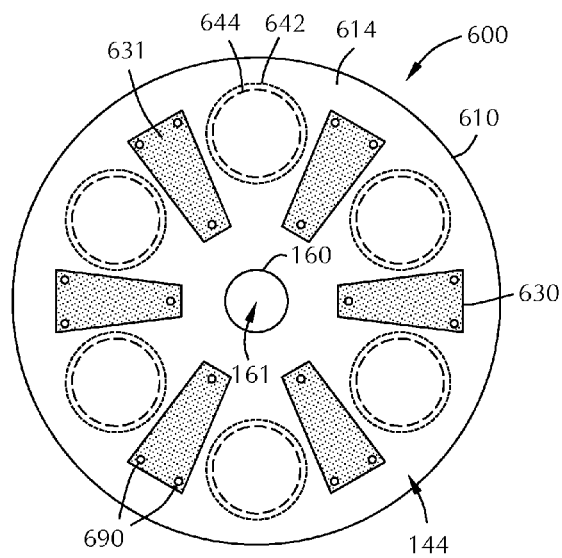
FIG. 7 shows a susceptor assembly in accordance with one or more embodiment of the disclosure.
Figure 8:
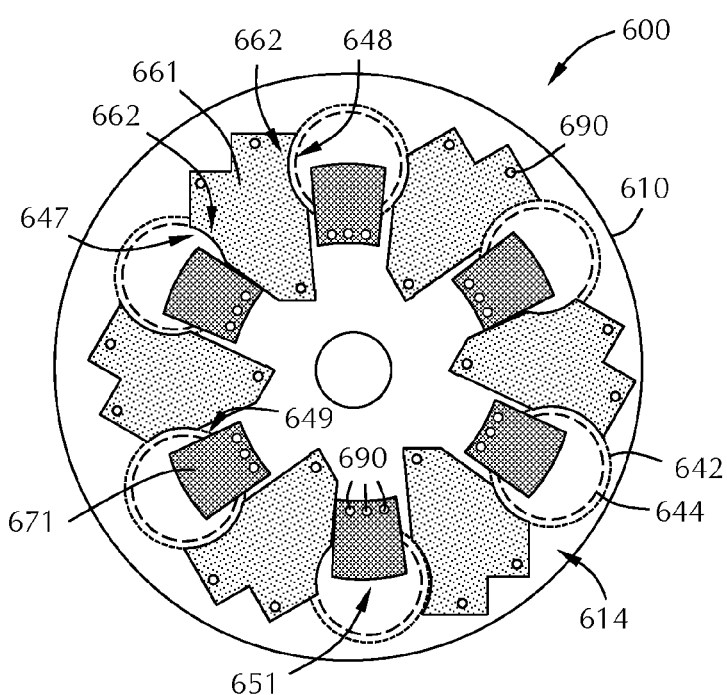
FIG. 8 shows a susceptor assembly in accordance with one or more embodiment of the disclosure.
Figure 9:
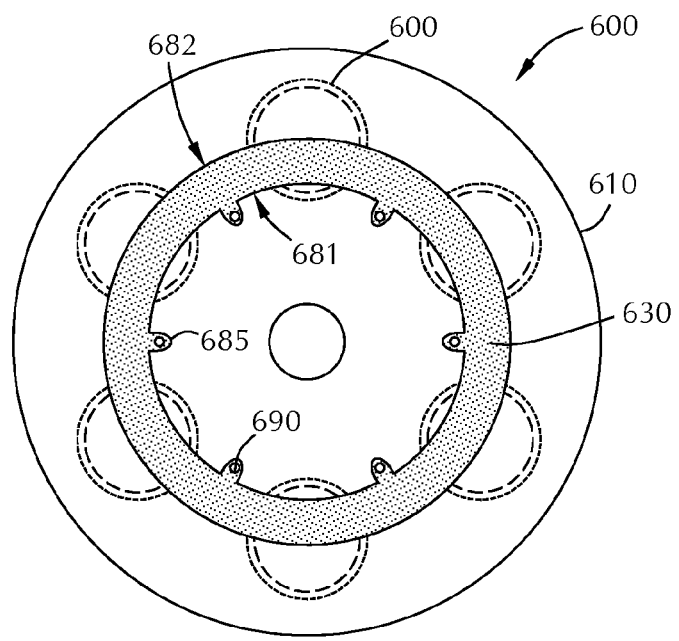
FIG. 9 shows a susceptor assembly in accordance with one or more embodiment of the disclosure.

FIGS. 7-9 show embodiments of the susceptor assembly 600. Each of these embodiments is shown looking at the bottom surface 614 of the susceptor 610. The recesses 642 and ledge 644 are drawn dotted lines to show the location of the recesses on the non-visible side of the susceptor 610. The recesses 642 are shown in this manner to illustrate the relative locations of the recesses and the shields.

In the embodiment of FIG. 7, the shield 630 comprises a plurality of shield segments 631. Each segment 631 is positioned in a region between recesses 642 in the top surface of the susceptor 610. Each of the shield segments 631 in FIG. 7 is wedge-shaped extending radially from a center 161 of the susceptor 610 toward an outer peripheral edge 144 of the susceptor 610. The shield segments 631 shown do not overlap with the recesses 642 but it will be understood by those skilled in the art that there can be some overlap. In some embodiments, the shield 630 does not have a continuous shield surface that blocks direct line of sight between the heater 620 and the bottom surface 614 of the susceptor. In some embodiments, the shield segments are positioned decrease a local temperature of the susceptor to improve temperature uniformity.

FIG. 8 shows another embodiment of the disclosure in which there are to different types of shield segments 631. The first segments 661 are contoured to have a shape similar to the shape of the recesses 642. The contoured regions 662 shown are rounded to mimic the shape of the recesses 642 adjacent that contoured regions 662.

In some embodiments, the shield segments 661 are shaped to cover more of the leading edge 647 of the recess 642 than the trailing edge 548 of the adjacent recess 642. Without being bound by any particular theory of operation, it is believed that the rotation of the susceptor 610 drags the process gases between the regions and that the leading edge 647 is exposed to a higher concentration of process gases. The shielding is believed to decrease the relative temperature near the leading edge so that the deposition is consistent with the center and trailing edge of the substrate, which is maintained at a higher temperature but with a lower local reactive gas concentration.

The second type of shield segments 671 shown in FIG. 8 are aligned with the recesses 642 to overlap. As used in this regard, the term "overlap" means that the vertical positioning of the recesses and the shield segments are aligned. Those skilled in the art will understand that the shield segments are not located physically over the recesses. The shield segments 671 extend from a region inside the inner edge 649 of the recess 642 toward a center 651 of the recess 642. The shield segment 671 can extend less than the center 651, to the center 651 or beyond the center 651 of the recess 642.

In some embodiments, the shield segments 661 are present without shield segments 671. In some embodiments, shield segments 671 are present without shield segments 661. In some embodiments, both shield segment 661 and shield segment 671 are present.

FIG. 9 shows another embodiment of the susceptor assembly 600 in which the shield 630 is ring shaped. The ring has an inner edge 681 and an outer edge 682. The inner edge 681 is closer to the center 161 of the susceptor 610 than the outer edge 682.

In some embodiments, the inner edge 681 of the shield 630 is positioned within a first quarter of a width of the recess 642. As used in this regard, the width of the recess 642 is defined as the distance from the point of the recess closest to the center 161 of the susceptor to the point of the recess furthest from the center 161 of the susceptor. The center of the recess 642 is at 50% of the width of the recess. In some embodiments, the inner edge 681 of the shield 630 is positioned within the inner 40%, 35%, 30%, 25%, 20%, 15%, 10% or 5% of the width of the recess. In some embodiments, the inner edge 681 is located outside the bounds of the recess closer to the center of the susceptor.

In some embodiments, the outer edge 682 of the shield 630 is positioned within a second half of the width of the recess 642. In some embodiments, the outer edge 682 of the shield 630 is positioned within the outer 40%, 35%, 30%, 25%, 20%, 15%, 10% or 5% of the width of the recess. Stated differently, in some embodiments, the outer edge 682 of the shield 630 is positioned at a point greater than or equal to about 60%, 65%, 70%, 75%, 80%, 85%, 90% or 95% of the width of the recess. In some embodiments, the outer edge 682 of the shield 630 is located outside the outer edge of the recess.

In some embodiments, the inner edge of the shield is positioned within the first quarter (<25%) of the width of the recess and the outer edge of the shield is positioned within a fourth quarter (>75%) of the width of the recess. In some embodiments, the distance from the inner edge of the shield to the outer edge of the shield covers at least about ⅓, ½, or ⅔ of the width of the recess. In some embodiments, the distance from the inner edge of the shield to the outer edge of the shield covers at least about 25%, 30%, 35%, 40%, 45%, 50%, 55%, 60%, 65% of 70% of the width of the recess.

The shield 630 can be made from any suitable material. In some embodiments, the shield is made from one or more of stainless steel, aluminum oxide or aluminum nitride. In some embodiments, the shield comprises a dielectric material. In some embodiments, the shield comprises a ceramic material.

Referring again to FIG. 6, the shield 630 is positioned a distance from the bottom surface 614 of the susceptor 610 to form a gap G. In some embodiments, the gap G is in the range of about 0.25 mm to about 6 mm. In some embodiments, the gap G is greater than or equal to about 0.25 mm, 0.5 mm, 0.75 mm, 1 mm, 1.5 mm, 2 mm or 2.5 mm. In some embodiments, the gap G is less than or equal to about 6 mm, 5.5, mm, 5 mm, 4.5 mm, 4 mm or 3.5 mm. In some embodiments, the gap G is in the range of about 1 mm to about 5 mm, or in the range of about 2 mm to about 4 mm, or in the range of about 2.5 mm to about 3.5 mm, or about 3 mm.

The heater 620 is spaced a distance D from the shield 630. In some embodiments, the heater 620 is spaced from the shield 630 a distance in the range of about 30 mm to about 80 mm, or in the range of about 4 mm to about 70 mm. In some embodiments, the heater 620 and the shield 630 are a distance apart greater than or equal to about 30 mm, 40 mm or 50 mm. In some embodiments, the heater 620 is about 60 mm from the shield 630. In some embodiments, the heater 620 is a separate component from the susceptor 610 or shield 630.

As shown in FIG. 6, in some embodiments, the susceptor assembly 600 includes a plurality of suspension rods 695 connected to the susceptor 610. The suspension rods 695 can support the shield 630 and maintaining a gap G between the shield 630 and the susceptor 610. The suspension rods 695 can pass through an opening 690 in the shield 630. In some embodiments, each of the suspension rods 695 comprises a shoulder screw 696 to connect the shield 630 to the suspension rod 695.

A controller 680 includes central processing unit (CPU) 682, memory 684, and support circuits 686. Central processing unit 682 may be one of any form of computer processor that can be used in an industrial setting for controlling various chambers and sub-processors. Memory 684 is coupled to CPU 682 and may be one or more of readily available memory such as random access memory (RAM), read only memory (ROM), flash memory, compact disc, floppy disk, hard disk, or any other form of local or remote digital storage. Support circuits 686 are coupled to CPU 682 for supporting CPU 682 in a conventional manner. These circuits may include cache, power supplies, clock circuits, input/output circuitry, subsystems, and the like.

In some embodiments, the controller includes a non-transitory computer-readable medium containing computer code that, when executed by operation of one or more computer processors, performs an operation for controlling deposition processes in the chamber. The computer code can include instruction sets for the processor to enable the processor to, inter alia, control the heaters (power, temperature, position), heat shields, susceptor assembly rotation and lift and/or the gas distribution assembly including gas flows.

The computer program code of some embodiments includes data models defining acceptable levels within the chamber for each of a plurality of gas types. The computer program code can include models or look-up tables to determine heater power settings for temperature control. In some embodiments, the computer program code includes models to determine position of one or more heat shields based on temperature feedback circuits.

In some embodiments, each shield segment 631, 661, 671 is supported by at least three suspension rods 695. In some embodiments, each shield segment 631, 661, 671 comprises at least three openings 690 to allow the suspension rod to pass therethrough. As can be seen in FIGS. 7 and 8, some embodiments of the shield segments have three openings 690.

As shown in FIG. 9, some embodiments of the shield 630 include a plurality of protrusions 685 extending inwardly from the inner edge 681. The protrusions 685 can include an opening 690 to allow a suspension rod to pass therethrough. In some embodiments, the shield 630 is supported by six suspension rods passing through six openings 690 in the shield 630.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, annealing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, anneal, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants.

According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In embodiments, where one or more of the parts of the methods takes place in one chamber, the process may be a spatial ALD process. Although one or more of the chemistries described above may not be compatible (i.e., result in reaction other than on the substrate surface and/or deposit on the chamber), spatial separation ensures that the reagents are not exposed to each in the gas phase. For example, temporal ALD involves the purging the deposition chamber. However, in practice it is sometimes not possible to purge the excess reagent out of the chamber before flowing in additional regent. Therefore, any leftover reagent in the chamber may react. With spatial separation, excess reagent does not need to be purged, and cross-contamination is limited.

Furthermore, a lot of time can be used to purge a chamber, and therefore throughput can be increased by eliminating the purge step.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A susceptor assembly comprising:
    a susceptor with a top surface and a bottom surface, the top surface having a plurality of recesses formed therein, the recesses sized to support a substrate during processing;
    a heater positioned below the susceptor to heat the susceptor, the heater is not an induction heater; and
    a shield positioned between the bottom surface of the susceptor and the heater, the shield increasing deposition uniformity across the susceptor.

2. The susceptor assembly of claim 1, wherein the shield comprises a plurality of shield segments, each segment positioned in a region between the recesses.

3. The susceptor assembly of claim 2, wherein each of the shield segments is wedge-shaped extending radially from a center of the susceptor.

4. The susceptor assembly of claim 2, wherein each of the shield segments is contoured to have a shape similar to a shape of the recesses.

5. The susceptor assembly of claim 4, wherein the shield segments cover more of a leading edge of a recess than a trailing edge of an adjacent recess.

6. The susceptor assembly of claim 2, wherein each of the shield segments is aligned with a recess and extends from a region inside an inner edge of a recess toward a center of the recess.

7. The susceptor assembly of claim 1, wherein the shield is ring shaped with an inner edge and an outer edge, the inner edge closer to a center of the susceptor than the outer edge.

8. The susceptor assembly of claim 7, wherein the shield comprises a plurality of protrusions extending inwardly from the inner edge.

9. The susceptor assembly of claim 8, wherein at least some of the plurality of protrusions comprises an opening to allow a suspension rod to pass therethrough.

10. The susceptor assembly of claim 7, wherein the inner edge of the shield is positioned within a first quarter of a width of the recesses.

11. The susceptor assembly of claim 7, wherein the outer edge of the shield is positioned within a second half of a width of the recesses.

12. The susceptor assembly of claim 7, wherein the inner edge of the shield is positioned within a first quarter of a width of the recesses, and the outer edge of the shield is positioned within a fourth quarter of the width of the recesses.

13. The susceptor assembly of claim 7, wherein a distance from the inner edge of the shield to the outer edge of the shield covers at least about ⅔ of a width of the recesses.

14. The susceptor assembly of claim 1, wherein the shield is made from one or more of stainless steel, aluminum oxide or aluminum nitride.

15. The susceptor assembly of claim 1, wherein the shield is positioned a distance from the bottom surface of the susceptor to form a gap in a range of about 0.25 mm to about 6 mm.

16. The susceptor assembly of claim 15, wherein the heater is spaced in a range of about 30 mm to about 80 mm from the shield.

17. The susceptor assembly of claim 1, further comprising a plurality of suspension rods connected to the susceptor, the suspension rods supporting the shield and maintaining a gap between the shield and the susceptor.

18. The susceptor assembly of claim 17, wherein each of the suspension rods comprises a shoulder screw to connect the shield to the suspension rods.

19. A susceptor assembly comprising:
    a susceptor with a top surface and a bottom surface, the top surface having a plurality of recesses formed therein, the recesses sized to support a substrate during processing;
    a heater positioned below the susceptor to heat the susceptor, the heater is not an induction heater;
    a shield positioned between the bottom surface of the susceptor and the heater, the shield comprising a plurality of shield segments, each shield segment positioned in a region between the recesses and increasing deposition uniformity across the susceptor, each shield segment is contoured to have a shape similar to a shape of the recesses and cover more of a leading edge of a recess than a trailing edge of an adjacent recess, each shield segment including a plurality of openings therethrough; and
    a plurality of suspension rods connected to the susceptor and passing through the plurality of openings in the shield segments to support the shield segments and maintain a gap between the shield segments and the susceptor.

20. A susceptor assembly comprising:
    a susceptor with a top surface and a bottom surface, the top surface having a plurality of recesses formed therein, the recesses sized to support a substrate during processing;
    a heater positioned below the susceptor to heat the susceptor, the heater is not an induction heater; and
    a shield positioned between the bottom surface of the susceptor and the heater, the shield increasing deposition uniformity across the susceptor, the shield having a ring shape with an inner edge and an outer edge, the inner edge closer to a center of the susceptor than the outer edge, the shield including a plurality of protrusions extending inwardly from the inner edge, each protrusion having an opening therethrough, a distance from the inner edge of the shield to the outer edge of the shield covers at least about ⅔ of a width of the recess; and a plurality of suspension rods connected to the susceptor, the suspension rods supporting the shield and maintaining a gap between the shield and the susceptor, each of the suspension rods passing through an opening in the shield.

\* \* \* \* \*